(12) United States Patent
Shimizu

(10) Patent No.: US 12,408,277 B2
(45) Date of Patent: Sep. 2, 2025

(54) COMPONENT-ATTACHED FPC MANUFACTURING METHOD

(71) Applicant: Yazaki Corporation, Tokyo (JP)

(72) Inventor: Hidehiko Shimizu, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 18/805,678

(22) Filed: Aug. 15, 2024

(65) Prior Publication Data

US 2025/0071910 A1    Feb. 27, 2025

(30) Foreign Application Priority Data

Aug. 22, 2023    (JP) ................ 2023-134658

(51) Int. Cl.
| | |
|---|---|
| *B23K 1/00* | (2006.01) |
| *H05K 1/18* | (2006.01) |
| *H05K 3/34* | (2006.01) |
| *B23K 101/42* | (2006.01) |

(52) U.S. Cl.
CPC ........... *H05K 3/341* (2013.01); *B23K 1/0016* (2013.01); *H05K 1/189* (2013.01); *H05K 3/3494* (2013.01); *B23K 2101/42* (2018.08)

(58) Field of Classification Search
CPC ...... H05K 3/341; H05K 1/189; H05K 3/3494; H05K 1/147; H05K 3/3442; H05K 3/363; B23K 1/0016; B23K 2101/36–42

USPC ................ 228/159–163, 179.1–180.22
See application file for complete search history.

(56) References Cited

U.S. PATENT DOCUMENTS

| | | | |
|---|---|---|---|
| 7,322,833 B1 * | 1/2008 | Hakansson | H05K 3/365 439/67 |
| 2017/0082875 A1 * | 3/2017 | Sugiyama | G02F 1/025 |
| 2018/0061743 A1 * | 3/2018 | Hsu | H05K 1/148 |
| 2020/0196452 A1 * | 6/2020 | Lee | G06F 3/0412 |

FOREIGN PATENT DOCUMENTS

| | | | | |
|---|---|---|---|---|
| EP | 2444283 B1 * | 2/2020 | ........... | B60R 1/1207 |
| JP | 06-120653 A | 4/1994 | | |
| KR | 20110016794 A * | 2/2011 | ......... | G02F 1/13452 |

* cited by examiner

*Primary Examiner* — Kiley S Stoner
(74) *Attorney, Agent, or Firm* — Sughrue Mion, PLLC

(57) ABSTRACT

A component-attached FPC manufacturing method for manufacturing a component-attached FPC in which a circuit component is solder-bonded to an FPC, includes an FPC forming step of forming an FPC that integrally includes an FPC body, an FPC arm portion branching off from the FPC body, a component mounting portion provided on an end portion of the FPC arm portion and on which the circuit component is mounted, and a bridge connecting the component mounting portion and the FPC body, a component mounting step of mounting the circuit component on the component mounting portion via a solder, and an implementing step of heating the FPC, melting the solder, and implementing the circuit component on the component mounting portion.

5 Claims, 6 Drawing Sheets

PRIOR ART

COMPONENT-ATTACHED FPC MANUFACTURING METHOD

TECHNICAL FIELD

The present disclosure relates to a component-attached FPC manufacturing method.

BACKGROUND

For example, Patent Document 1 discloses a technique to mount chip components on a flexible substrate by placing the flexible substrate on a tray, placing the chip components on the flexible substrate, and mounting the chip components on the flexible substrate by reflow deposition.

One example of a technique for mounting chip components on a flexible substrate by reflow deposition is a technique of mounting chip components on the flexible substrate by reflow deposition upon placing a plate having an opening on the flexible substrate to expose the chip component through the opening and pressing the flexible substrate with the plate in order to prevent the flexible substrate from warping.

RELATED ART

Patent Documents

[Patent Document 1] JPH06120653 A

SUMMARY OF THE INVENTION

Problem to be Solved by the Invention

However, in a conventional method of mounting chip components on a flexible substrate, as illustrated in FIGS. 11, 12, when chip components 102 are mounted on a portion exposed from an opening 152a of a plate 152, i.e., a portion 103A branching off from a flexible substrate (FPC) 103, during reflow deposition, there was a concern that the portion 103A on which the chip component 102 is mounted may warp, causing the chip component (circuit component) 102 to be mounted in an out-of-position state, i.e., resulting in a mounting failure.

It is an object of the present disclosure to provide a component-attached FPC manufacturing method that allows a circuit component to be mounted at predetermined location branched off from an FPC body.

Solution to Problem

According to an aspect of the present disclosure, a component-attached FPC manufacturing method for manufacturing a component-attached FPC in which a circuit component is solder-bonded to an FPC, includes an FPC forming step of forming an FPC that integrally includes an FPC body, an FPC arm portion branching off from the FPC body, a component mounting portion provided on an end portion of the FPC arm portion and on which the circuit component is mounted, and a bridge connecting the component mounting portion and the FPC body, a component mounting step of mounting the circuit component on the component mounting portion via a solder, and an implementing step of heating the FPC, melting the solder, and implementing the circuit component on the component mounting portion.

According to another aspect of the present disclosure, a component-attached FPC manufacturing method for manufacturing a component-attached FPC in which a circuit component is solder-bonded to an FPC, includes an FPC forming step of forming an FPC that integrally includes an FPC body, an FPC arm portion branching off from the FPC body, a component mounting portion provided on an end portion of the FPC arm portion and on which the circuit component is mounted, and an extension portion extending from a peripheral edge of the component mounting portion, a component mounting step of mounting the circuit component on the component mounting portion via a solder, a plate mounting step of mounting a plate such that at least a portion of the extension portion is covered and the component mounting portion, and an implementing step of heating the FPC, melting the solder, and implementing the circuit component on the component mounting portion.

Advantageous Effects of the Invention

According to the present disclosure, a circuit component can be mounted at predetermined location branched off from an FPC body.

DETAILED DESCRIPTION OF THE EXEMPLARY EMBODIMENT

First Embodiment

Figure 1:
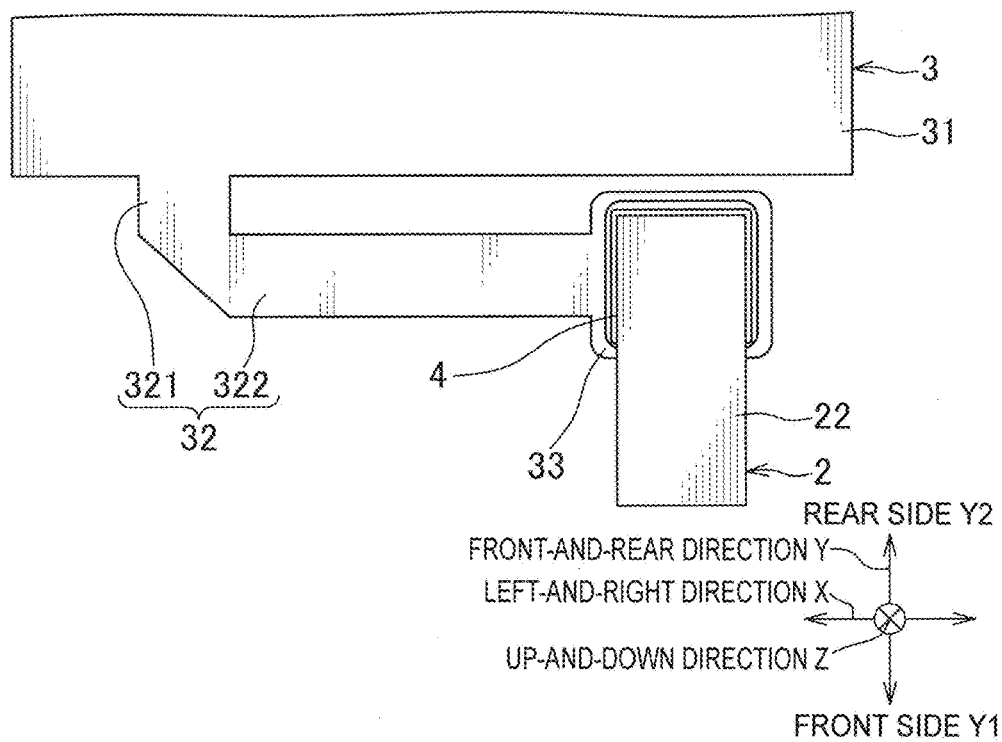
FIG. 1 is a plan view illustrating a component-attached FPC manufactured by a component-attached FPC manufacturing method according to a first embodiment of the present disclosure.

Hereinafter, a component-attached FPC manufacturing method 1 according to the first embodiment of the present disclosure is explained with reference to FIGS. 1 to 6. FIG. 1 is a plan view illustrating a component-attached FPC 10 manufactured by a component-attached FPC manufacturing method 1 according to a first embodiment of the present disclosure.

As illustrated in FIG. 1, the component-attached FPC 10 manufactured by the component-attached FPC manufacturing method 1 includes a circuit component 2 and an FPC 3 (Flexible Printed Circuits) to which the circuit component 2 is solder-bonded. In the present embodiment, the arrows X, Y, and Z are directions perpendicular to each other. The arrows X and Y indicate the planar direction in which the FPC 3 extends, and the arrow Z indicates the direction in which the circuit component 2 is mounted relative to the FPC 3.

The circuit component 2 is solder-bonded to a component mounting portion 33 of the FPC 3 (described later) and is electrically connected to a circuit formed in the FPC 3. In this case, the circuit component 2 is an element that performs various functions. Examples of the circuit component 2 include a connector, a capacitor, a relay, a resistor, a transistor, an IPS (Intelligent Power Switch), and an electronic control unit including a microcomputer. As illustrated in FIG. 1, the circuit component 2 includes a circuit component body (not illustrated) and multiple connection portions 22 extending from both ends of the circuit component body (in the figure, only one of the multiple connection portions 22 is illustrated, and the others are omitted). In the following, one of the multiple connection portions 22 may be referred to as a "first connection portion" and the others may be referred to as "second connection portions".

In the present embodiment, the first connection portion 22 is constituted by a conductive metal tab in a rectangular plate shape. The first connection portion 22 is disposed so that a portion of the first connection portion 22 extends from the component mounting portion 33 provided on the FPC 3, which will be described later.

Figure 3:
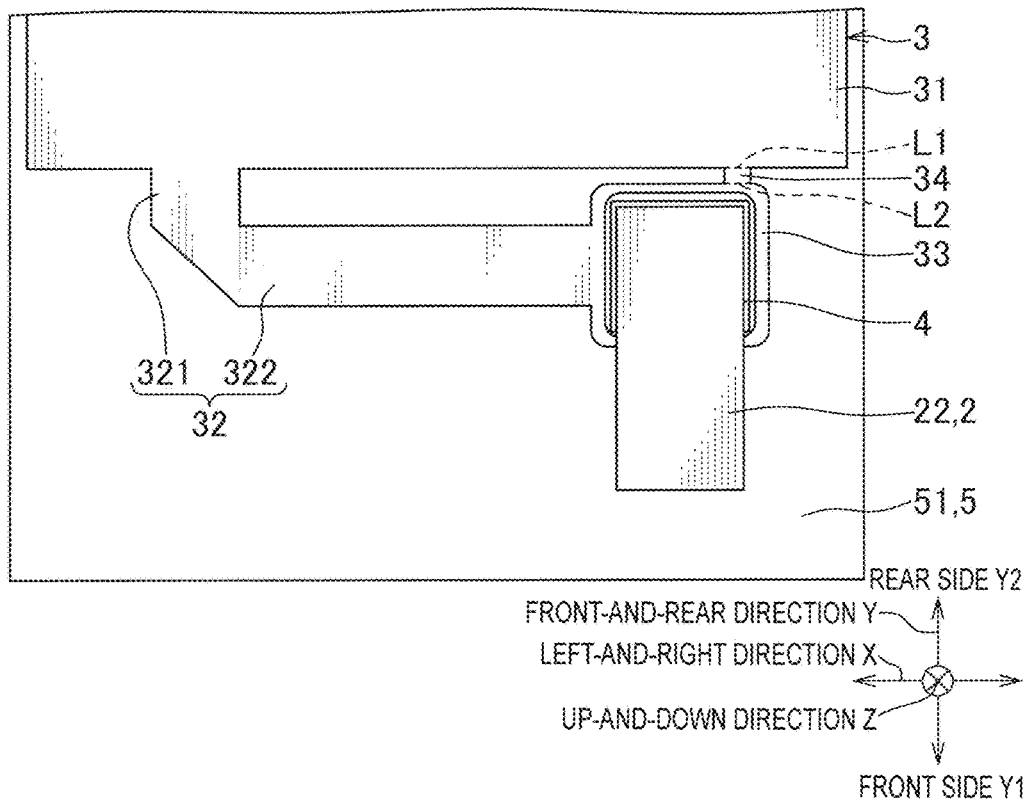
FIG. 3 is a diagram for explaining the manufacturing process of the component-attached FPC, illustrating a state in which a circuit component is mounted on the FPC.

As illustrated in FIGS. 1, 3, the FPC 3 integrally includes an FPC body 31 formed in a rectangular shape, an FPC arm portion 32 branching off from the FPC body 31, a component mounting portion 33 which is provided on the end portion of the FPC arm portion 32 and on which a first connection portion 22 of a circuit component 2 is mounted, and a bridge 34 connecting the component mounting portion 33 and the FPC body 31.

As illustrated in FIG. 3, the FPC body 31 is formed in a rectangular shape. The FPC body 31 includes a pair of first edges 31a, 31a that form both ends of the FPC body 31 in the left-right direction X and extend in the front-rear direction Y, and a second edge 31b that is continuous with the pair of first edges 31a, 31a and extends in the left-right direction X.

As illustrated in FIG. 3, the FPC arm portion 32 includes an FPC arm portion body 321 in a strip shape extending to the front side Y1 from the second edge 31b of the FPC body 31, and an FPC extension portion 322 in a strip shape bent at a right angle at an end of the FPC arm portion body 321 away from the FPC body 31 and extending in the left-and-right direction X. One end 32L of the FPC arm portion 32 is continuous with the second edge 31b of the FPC body 31, and the other end 32R is continuous with a first peripheral edge 33a of a component mounting portion 33 described below.

As illustrated in FIG. 3, the component mounting portion 33 is formed in a rectangular shape. The component mounting portion 33 includes a first peripheral edge 33a and a second peripheral edge 33b extending in the front-and-rear direction Y, and a third peripheral edge 33c and a fourth peripheral edge 33d extending in the left-and-right direction X. Furthermore, the component mounting portion 33 is provided on the opposite side of the FPC extension portion 322 from the FPC arm portion body 321 in left-and-right direction X. Solder printing is applied to the upper surface of the component mounting portion 33. In the following, solder is given a reference numeral 4. Further, the component mounting portion 33 is configured so that the first connection portion 22 of the circuit component 2 is electrically connected to the component mounting portion 33 via the solder 4. That is, the circuit component 2 is mounted on the component mounting portion 33.

The bridge 34 is formed in a strip shape as illustrated in FIG. 3. The bridge 34 is situated between the FPC body 31 and the component mounting portion 33 and is provided continuously with both of them. The bridge 34 extends in the front-and-rear direction Y, with one end continuing to the second edge 31b of the FPC body 31 and the other end continuing to the third peripheral edge 33c of the component mounting portion 33.

Next, a manufacturing apparatus 5 used in the manufacturing the component-attached FPC 10 is explained with reference to FIG. 4.

Figure 4:
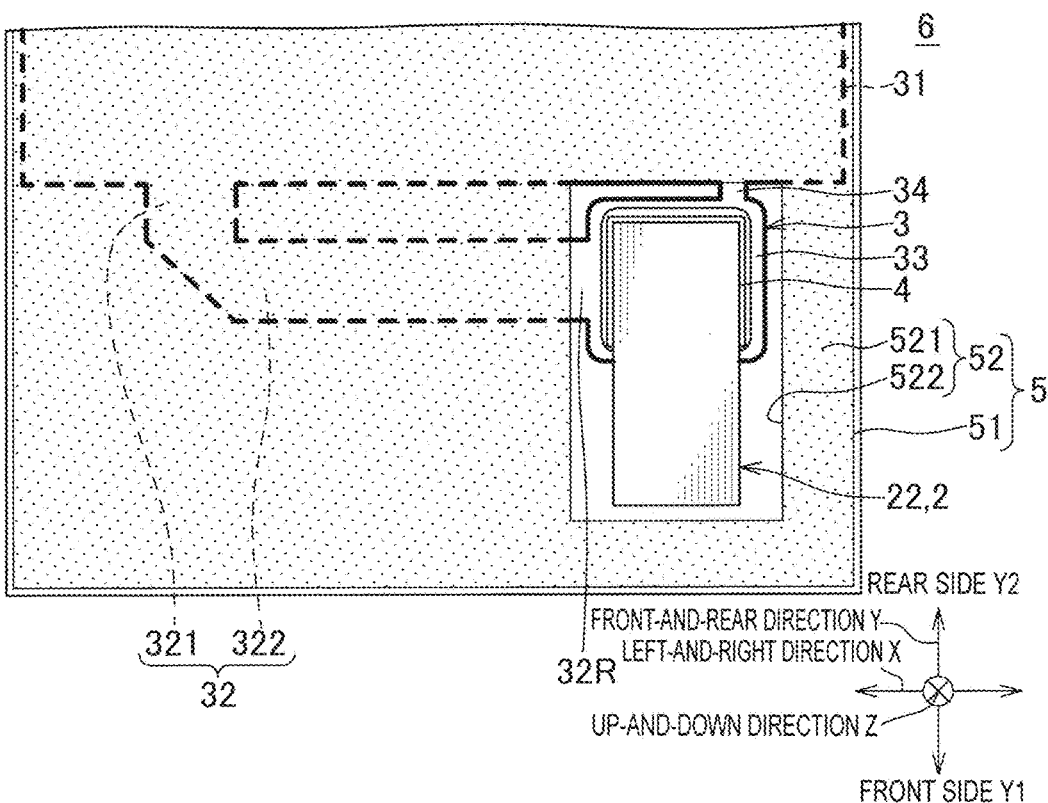
FIG. 4 is a diagram illustrating a process subsequent to the step of FIG. 3, illustrating a state in which a plate has been mounted on the FPC.

As illustrated in FIGS. 3 and 4, the manufacturing apparatus 5 includes a tray 51 on which the FPC 3 is placed, a reflow furnace (not illustrated) that melts the solder 4 by heating, and a plate 52 (illustrated in FIG. 4) that covers and presses the FPC 3.

As illustrated in FIG. 4, the tray 51 is configured so that the FPC 3 and the circuit component 2 can be placed thereon. The tray 51 is formed in a flat plate shape and is configured to have an area larger than that of the component-attached FPC 10.

As illustrated in FIG. 4, the plate 52 includes a plate body 521 that is of such a size as to cover the FPC body 31 and a portion of the FPC arm portion 32 of the FPC 3, and an opening 522 in a rectangular shape provided in the plate body 521. The opening 522 is of such a size as to expose the component mounting portion 33, a portion of the FPC arm portion 32 including the other end 32R, and the first connection portion 22 of the circuit component 2.

Next, a method for manufacturing the component-attached FPC 10 using the manufacturing apparatus 5 (the component-attached FPC manufacturing method 1) is explained with reference to FIGS. 2 to 6.

Figure 2:
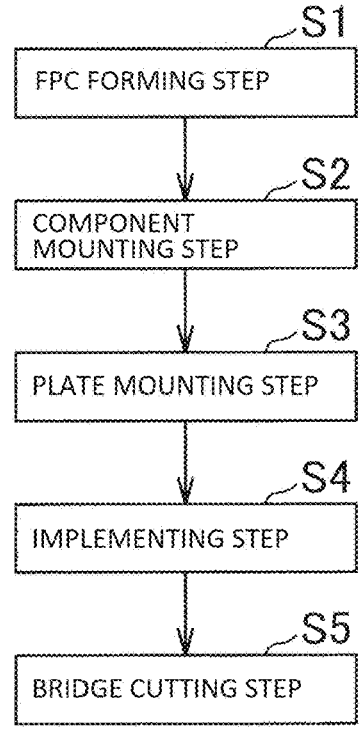
FIG. 2 is a schematic diagram for explaining the steps of the component-attached FPC manufacturing method.

First, as illustrated in FIGS. 2, 3, the FPC 3 is formed that integrally includes the FPC body 31, the FPC arm portion 32 branching off from the FPC body 31, the component mounting portion 33 provided on the FPC arm portion 32 and on which the circuit component 2 is mounted, and the bridge 34 connecting the component mounting portion 33 and the FPC body 31 (FPC forming step S1). Then, solder is printed on the upper surface of the component mounting portion 33. Then, the FPC 3 is placed in the tray 51.

Next, as illustrated in FIG. 4, the first connection portion 22 of the circuit component 2 are mounted on the component mounting portion 33 (component mounting step S2). The first connection portion 22 is placed such that a portion on the rear side Y2 is on the component mounting portion 33, and that a portion on the front side Y1 crosses the fourth peripheral edge 33d of the component mounting portion 33. In this manner, the circuit component 2 is mounted on the component mounting portion 33 via the solder 4.

Next, as illustrated in FIG. 4, the plate 52 is placed on the FPC 3 (plate mounting step S3). The plate 52 is placed such that the plate body 521 covers the FPC body 31 and a portion of the FPC arm portion 32, and that a portion of the FPC arm portion 32 including the other end 32R, the component mounting portion 33, the first connection portion 22 of the circuit component 2, and the bridge 34 are exposed from the opening 522. In the following, as illustrated in FIG. 4, a state in which the FPC 3 and the circuit component 2 are placed on the tray 51 and the plate 52 is placed at a predetermined position on the FPC 3 may be referred to as a "component set 6". If there is no risk of warping of the FPC body 31, the plate 52 may be omitted.

Next, the component set 6 is placed in the reflow furnace. Accordingly, the FPC 3 is heated, and the solder 4 is melted. In this case, the component mounting portion 33 is supported on the FPC body 31 by the bridge 34, and warping of the component mounting portion 33 is alleviated.

Thereafter, the first connection portion 22 of the circuit component 2 is electrically connected to the circuit formed in component mounting portion 33 of the FPC 3 via the solder 4. Also, second connection portion of circuit component 2 is electrically connected to the circuit at a predetermined position. Accordingly, the circuit component 2 is mounted on the component mounting portion 33 (implementing step S4). In this case, warping of the component mounting portion 33 is alleviated, so that the circuit component 2 is positioned at a predetermined position on the component mounting portion 33.

Figure 5:
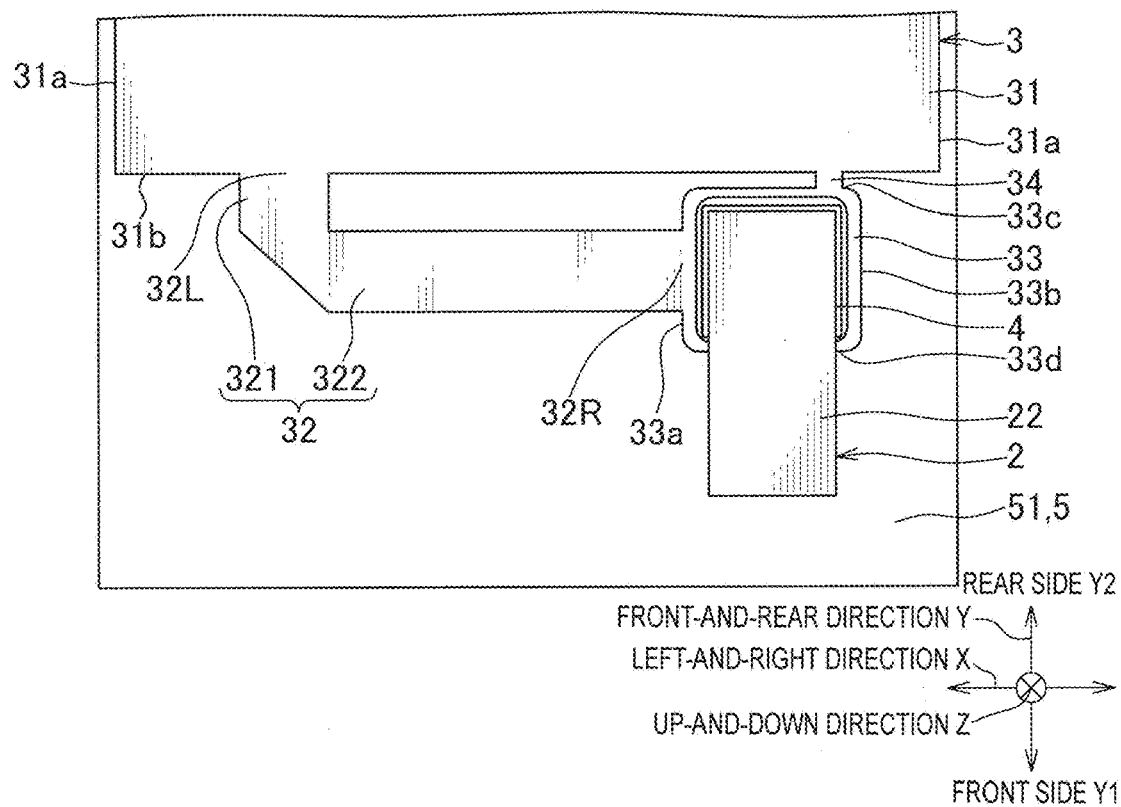
FIG. 5 is a diagram illustrating a process subsequent to the step of FIG. 4, illustrating a state in which the bridge on the FPC is cut.
Figure 6:
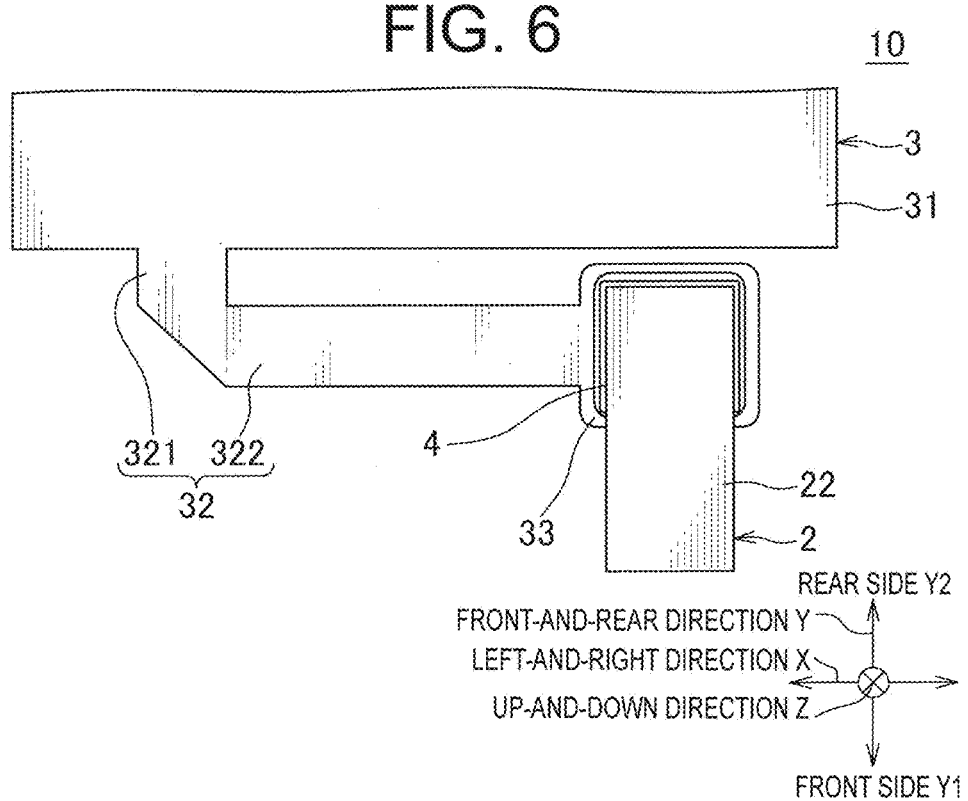
FIG. 6 is a diagram illustrating a process subsequent to the step of FIG. 5, and is a plan view illustrating a completed component-attached FPC.

Thereafter, the component set 6 is removed from the reflow furnace, and the plate 52 is removed. Then, as illustrated in FIG. 5, the bridge 34 is cut at a boundary position L1 between the bridge 34 and the FPC body 31 and at a boundary position L2 between the bridge 34 and the component mounting portion 33 (bridge cutting step S5). In this manner, the component-attached FPC 10 is completed as illustrated in FIG. 6.

According to the embodiment explained above, the component-attached FPC manufacturing method 1 for manufacturing the component-attached FPC 10 in which the circuit component 2 is solder-bonded to the FPC 3 includes an FPC forming step S1 of forming the FPC 3 that integrally includes the FPC body 31, the FPC arm portion 32 branching off from the FPC body 31, the component mounting portion 33 provided on the end of the FPC arm portion 32 and on which the circuit component 2 is mounted, and the bridge 34 connecting the component mounting portion 33 and the FPC body 31. Accordingly, when the FPC 3 is heated, the FPC 3 is heated in the reflow furnace while the component mounting portion 33 is supported on the FPC body 31 by the bridge 34, so that warping of the component mounting portion 33 is alleviated. As a result, the circuit component 2 can be mounted in a predetermined orientation at the predetermined position (the component mounting portion 33) branched off from the FPC body 31.

The plate mounting step S3 is provided to place the plate 52 such as to cover a portion of the FPC body 31 and a portion of the FPC arm portion 32 while exposing the component mounting portion 33. As a result, warping of the FPC body 31 is alleviated.

The bridge cutting step S5 of cutting the bridge 34 is provided, and the bridge cutting step S5 is performed after the implementing step S4. Accordingly, the unnecessary portion can be cut off to produce the component-attached FPC 10 that is light in weight.

It should be noted that the present disclosure is not limited to the above-mentioned embodiment, and includes other configurations that can achieve the purpose of the present disclosure, and the following modified embodiments are also included in the present disclosure.

In the embodiment explained above, in the component mounting step S2, the circuit component 2 is mounted on the component mounting portion 33 of the FPC 3, and thereafter, in the plate mounting step S3, the plate 52 is placed on the FPC 3, but the present disclosure is not limited thereto. After the plate 52 is placed on the FPC 3, the circuit component 2 may be placed on the component mounting portion 33 of the FPC 3. In other words, after the plate mounting step S3, the component mounting step S2 may be performed.

Figure 7:
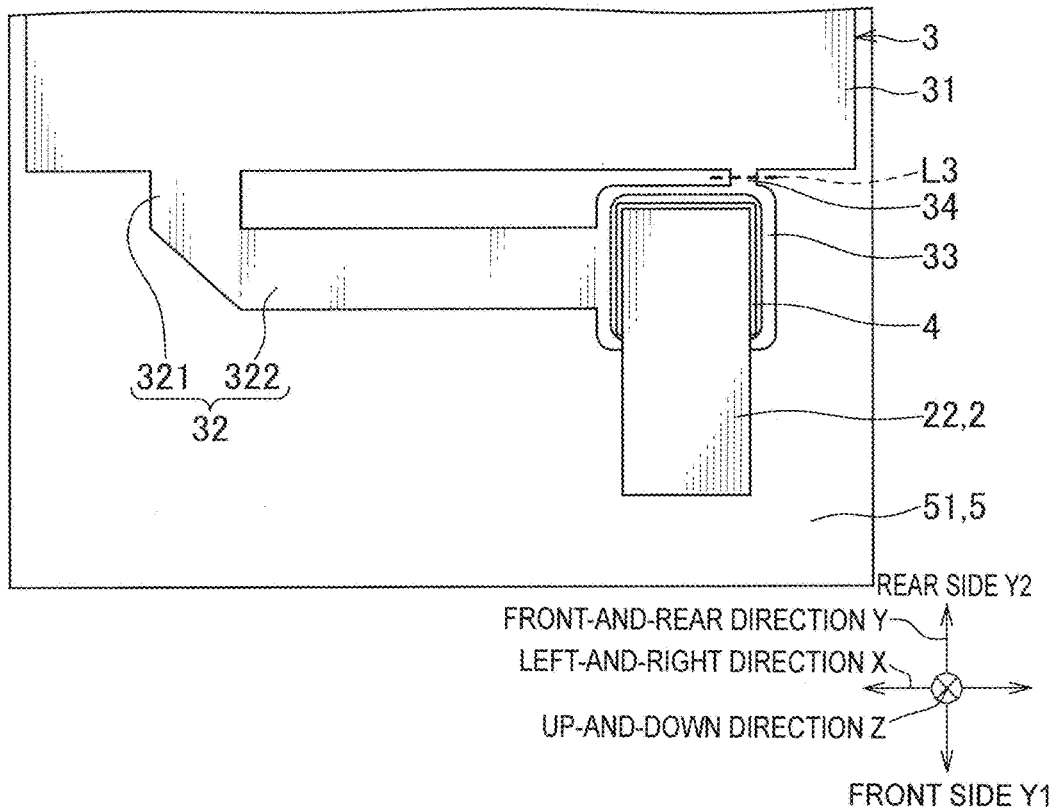
FIG. 7 is a plan view illustrating a modified example of a component-attached FPC manufactured by the component-attached FPC manufacturing method.

Furthermore, in the embodiment explained above, in the bridge cutting step S5, the bridge 34 is cut at the boundary position L1 between the bridge 34 and the FPC body 31 and at the boundary position L2 between the bridge 34 and the component mounting portion 33, but the present disclosure is not limited thereto. As illustrated in FIG. 7, the bridge 34 may be cut at an intermediate position L3 in the front-and-rear direction Y, or the bridge cutting step S5 may not be performed at all, so that a state in which the component mounting portion 33 and the FPC body 31 are connected, i.e., a state in which the bridge 34 is present, may be a completed state. Alternatively, a perforation may be provided in advance at least at one of positions L1 to L3.

Second Embodiment

Figure 8:
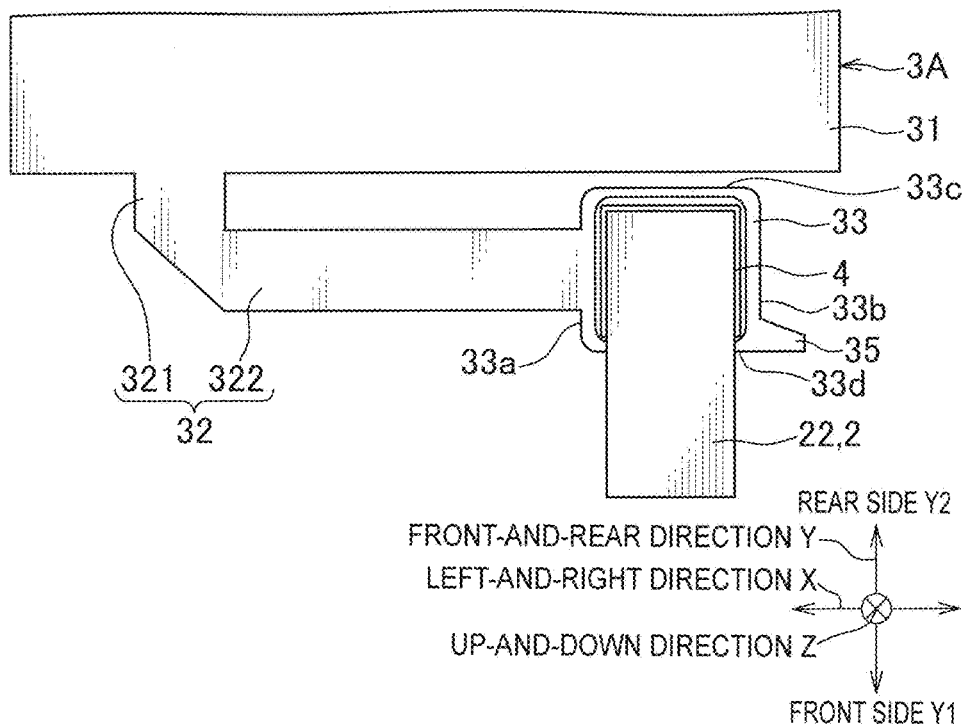
FIG. 8 is a plan view illustrating a component-attached FPC according to a second embodiment of the present disclosure.
Figure 9:
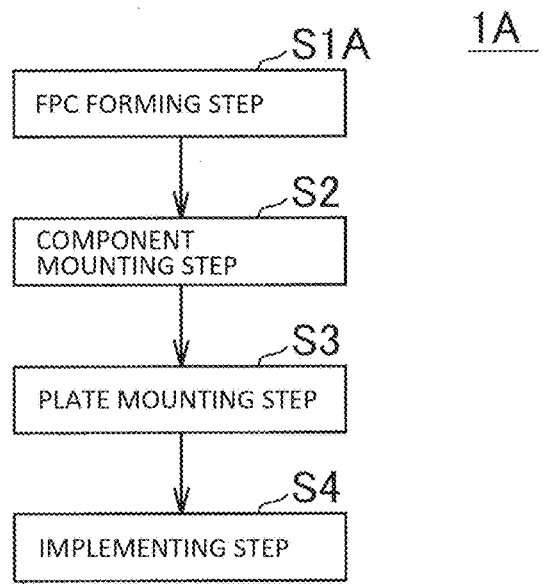
FIG. 9 is a schematic diagram for explaining the steps of the component-attached FPC manufacturing method.
Figure 10:
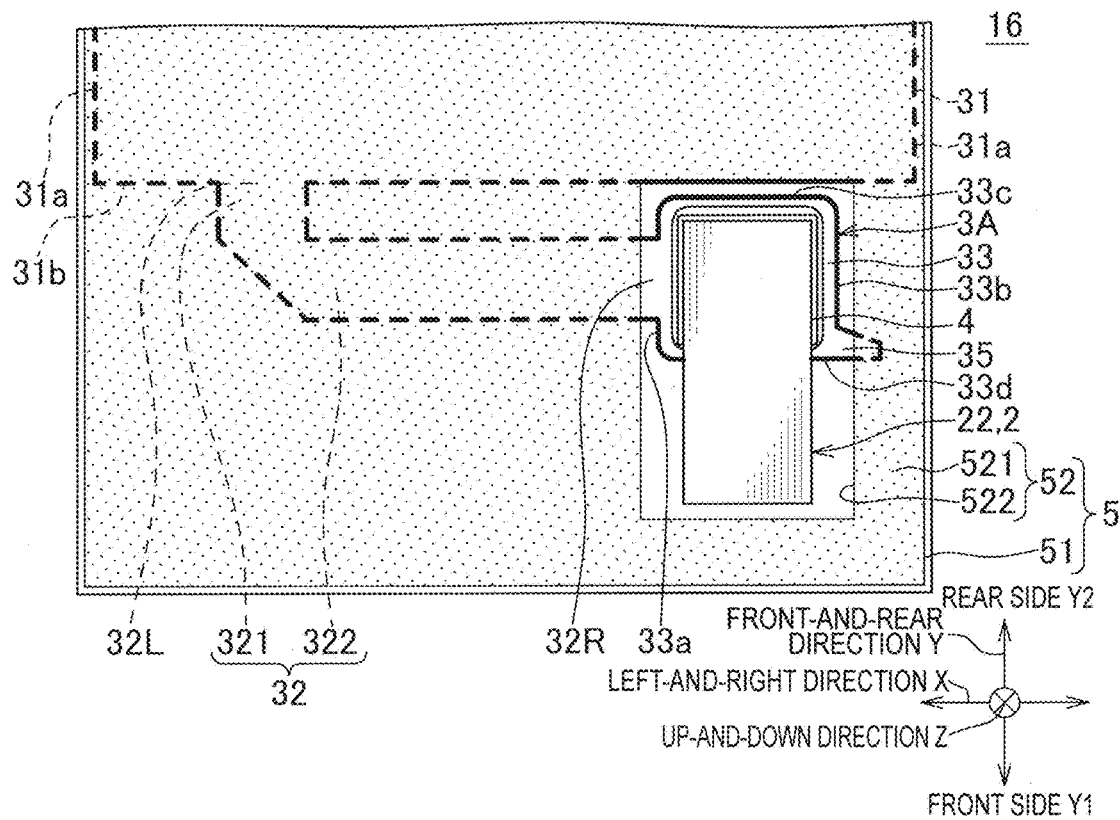
FIG. 10 is a diagram for explaining a manufacturing procedure for manufacturing the component-attached FPC, illustrating a state in which a plate is attached to the FPC.
Figure 11:
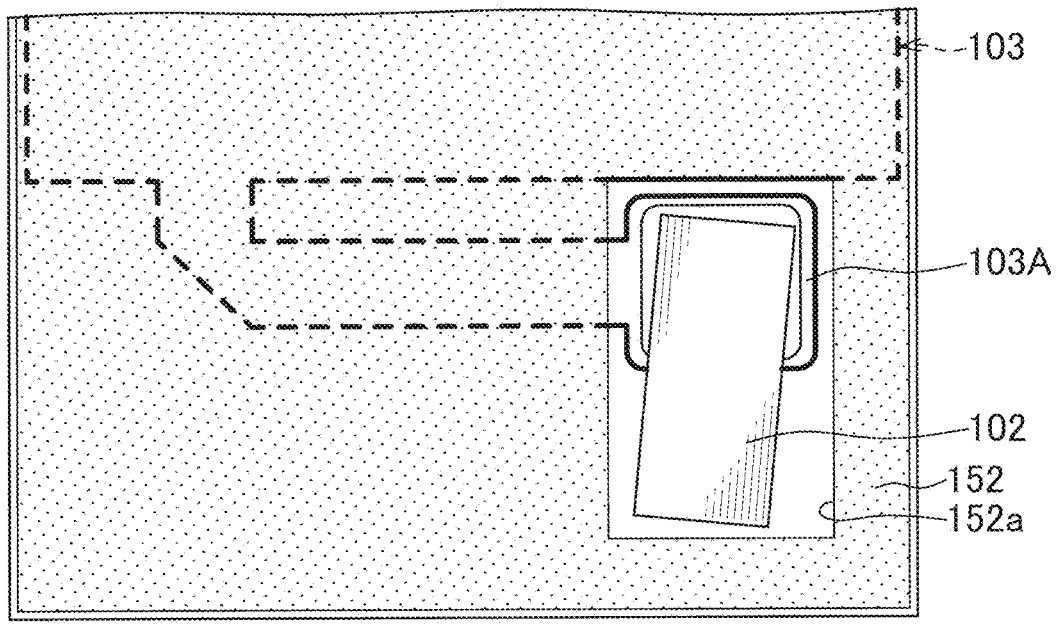
FIG. 11 is a diagram for explaining a problem to be solved by the present disclosure, and is a plan view illustrating a chip component-attached flexible substrate manufactured by a conventional mounting method for a flexible substrate.
Figure 12:
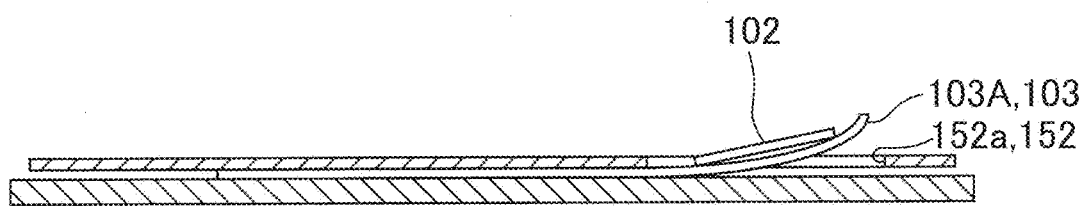
FIG. 12 is a cross-sectional view of the chip component-attached flexible substrate illustrated in FIG. 11.

Hereinafter, a component-attached FPC manufacturing method 1A according to the second embodiment of the present disclosure is explained with reference to FIGS. 8 to 10. FIG. 8 is a plan view illustrating a component-attached FPC 10A according to the second embodiment of the present disclosure. FIG. 9 is a schematic diagram for explaining the steps of the component-attached FPC manufacturing method 1A. FIG. 10 is a diagram for explaining a manufacturing procedure for manufacturing the component-attached FPC 10A, illustrating a state in which a plate 52 is attached to the FPC 3A. The component-attached FPC manufacturing method 1A according to the second embodiment and the component-attached FPC manufacturing method 1 according to the first embodiment differ in the configuration of the FPC 3A (3). In the following, in the second embodiment, constituent elements having the same configuration as those of the first embodiment are denoted with the same reference numerals and detailed description thereabout is omitted.

As illustrated in FIG. 8, the component-attached FPC 10A manufactured by the component-attached FPC manufacturing method 1A includes the circuit component 2 and the FPC 3A (Flexible Printed Circuits) to which the circuit component 2 is solder-bonded.

As illustrated in FIG. 8, the FPC 3A integrally includes an FPC body 31, an FPC arm portion 32 branching off from the FPC body 31, a component mounting portion 33 which is provided on the end portion of the FPC arm portion 32 and on which a first connection portion 22 of a circuit component 2 is mounted, and an extension portion 35 extending from the component mounting portion 33.

As illustrated in FIGS. 8 and 10, the extension portion 35 is configured to extend in a direction away from the FPC arm portion 32 at the distal end portion of the second peripheral edge 33b of the component mounting portion 33 (an end portion away from the FPC body 31 in the front-and-rear direction Y). This extension portion 35 refers to the portion extending from the second peripheral edge 33b of the component mounting portion 33.

Next, a method for manufacturing the component-attached FPC 10A using the manufacturing apparatus 5 (the component-attached FPC manufacturing method 1A) is explained with reference to FIGS. 8 to 10.

First, as illustrated in FIGS. 8, 9, the FPC 3A is formed that integrally includes the FPC body 31, the FPC arm portion 32 branching off from the FPC body 31, the component mounting portion 33 which is provided on the end portion of the FPC arm portion 32 and on which the circuit component 2 is mounted, and the extension portion 35 extending from the component mounting portion 33 (FPC forming step S1A). Then, solder is printed on the upper surface of the component mounting portion 33.

Next, the FPC 3A is placed on the tray 51. Then, the first connection portion 22 of the circuit component 2 is placed on the component mounting portion 33 (component mounting step S2). The first connection portion 22 is placed such that a portion on the rear side Y2 is on the component mounting portion 33, and that a portion on the front side Y1 crosses the fourth peripheral edge 33d of the component mounting portion 33.

Next, as illustrated in FIG. 10, the plate 52 is placed on the FPC 3A (plate mounting step S3). The plate 52 is placed such that the plate body 521 covers the FPC body 31 and a portion of the FPC arm portion 32, and such that a portion of the FPC arm portion 32 including the other end 32R, the component mounting portion 33, the first connection portion 22 of the circuit component 2, and the proximal end of the extension portion 35 are exposed from the opening 522. In the following, the state in which the FPC 3A and the circuit component 2 are placed on the tray 51 and the plate 52 is placed at a predetermined position on the FPC 3A as illustrated in FIG. 10 may be referred to as "component set 16".

Next, the component set 16 is put into the reflow furnace. Accordingly, the FPC 3A is heated, and the solder 4 is melted. In this case, the component mounting portion 33 is pressed by the plate 52 via the extension portion 35, and warping of the component mounting portion 33 is alleviated.

Thereafter, the first connection portion 22 of the circuit component 2 is electrically connected to the circuit formed on the component mounting portion 33 of the FPC 3A via the solder 4. In addition, the second connection portion of the circuit component 2 is electrically connected to the circuit at a predetermined position. As a result, the circuit component 2 is mounted on the component mounting portion 33 (implementing step S4). In this case, warping of the component mounting portion 33 is alleviated, so that the circuit component 2 is positioned at the predetermined position of the component mounting portion 33.

Thereafter, the component set 6 is removed from the reflow furnace, and the plate 52 is removed. In this manner, the component-attached FPC 10A is completed as illustrated in FIG. 8.

According to the embodiment explained above, the component-attached FPC manufacturing method 1A for manufacturing the component-attached FPC 10 in which the circuit component 2 is solder-bonded to the FPC 3A includes an FPC forming step S1A of forming the FPC 3A that integrally includes the FPC body 31, the FPC arm portion 32 branching off from the FPC body 31, the component mounting portion 33 which is provided on the end portion of the FPC arm portion 32 and on which the circuit component 2 is mounted, and the extension portion 35 extending from the peripheral edge of the component mounting portion 33, and a plate mounting step S3 of placing the plate 52 such that at least a portion of the extension portion 35 is covered and that the component mounting portion 33 is exposed. As a result, when the FPC 3A is heated, the FPC 3A is heated in a reflow furnace while the extension portion 35 is pressed by the plate 52, so that warping of the component mounting portion 33 is alleviated. As a result, the circuit component 2 can be mounted in a predetermined orientation at the predetermined position (the component mounting portion 33) branched off from the FPC body 31.

In the embodiment explained above, as illustrated in FIG. 8, the first connection portion 22 of the circuit component 2 is placed such that a portion on the rear side Y2 is on the component mounting portion 33, and that a portion on the front side Y1 crosses the fourth peripheral edge 33d of the component mounting portion 33. The extension portion 35 is configured to extend in a direction away from the FPC arm portion 32 in the left-and-right direction X at the distal end portion of the second peripheral edge 33b of the component mounting portion 33, but the present disclosure is not limited thereto. The first connection portion 22 of the circuit component 2 may be provided such that a portion of the first connection portion 22 is mounted on the component mounting portion 33, and the other portion of the first connection portion 22 is mounted across the second peripheral edge 33b of the component mounting portion 33. In that case, the extension portion may be configured to extend in a direction away from the FPC body 31 in the front-and-rear direction Y at the fourth peripheral edge 33d of the component mounting portion 33.

In the embodiment explained above, plate mounting step S3, the plate 52 is placed such that the proximal end of the extension portion 35 is exposed from the opening 522 of the plate 52, but the present disclosure is not limited thereto. In the plate mounting step S3, the plate 52 may be placed so that the entire extension portion 35 is covered by the plate 52.

Although the best configuration, method, and the like for carrying out the present invention are disclosed in the above description, the present invention is not limited thereto. That is, although the present invention has been particularly illustrated and described primarily with respect to the particular embodiment, it is understood that, without departing from the spirit and scope of the present invention, the present invention can be modified in various ways by those skilled in the art in terms of shape, material, quantity, and other detailed configurations of the embodiment described above. Therefore, since the descriptions that limit the shape, material, and the like disclosed above are illustrative examples to facilitate understanding of the present invention, and do not limit the present invention, a description with a name of a member, from which some or all of the limitations on the shape, material, and the like are deleted, is to be included in the present invention.

LIST OF REFERENCE SIGNS 1, 1A component-attached FPC manufacturing method
2 circuit component
3, 3A FPC
10, 10A component-attached FPC
31 FPC body
32 FPC arm portion
33 component mounting portion
34 bridge
35 extension portion
52 plate
S1, S1A FPC forming step
S2 component mounting step
S3 plate mounting step
S4 implementing step
S5 bridge cutting step

What is claimed is:

1. A component-attached FPC manufacturing method for manufacturing a component-attached FPC in which a circuit component is solder-bonded to an FPC, comprising:
- an FPC forming step of forming an FPC that integrally includes an FPC body, an FPC arm portion branching off from the FPC body, a component mounting portion provided on an end portion of the FPC arm portion and on which the circuit component is mounted, and a bridge connecting the component mounting portion and the FPC body;
- a component mounting step of mounting the circuit component on the component mounting portion via a solder; and
- an implementing step of heating the FPC, melting the solder, and implementing the circuit component on the component mounting portion.

2. The component-attached FPC manufacturing method according to claim 1, further comprising:
- a plate mounting step of mounting a plate such that a portion of the FPC body and a portion of the FPC arm portion are covered and the component mounting portion is exposed.

3. The component-attached FPC manufacturing method according to claim 1, further comprising:
- a bridge cutting step of cutting a bridge,
- wherein the bridge cutting step is performed after the implementing step.

4. The component-attached FPC manufacturing method according to claim 2, further comprising:
- a bridge cutting step of cutting a bridge,
- wherein the bridge cutting step is performed after the implementing step.

5. A component-attached FPC manufacturing method for manufacturing a component-attached FPC in which a circuit component is solder-bonded to an FPC, comprising:
- an FPC forming step of forming an FPC that integrally includes an FPC body, an FPC arm portion branching off from the FPC body, a component mounting portion provided on an end portion of the FPC arm portion and on which the circuit component is mounted, and an extension portion extending from a peripheral edge of the component mounting portion;
- a component mounting step of mounting the circuit component on the component mounting portion via a solder;
- a plate mounting step of mounting a plate such that at least a portion of the extension portion is covered and the component mounting portion is exposed; and
- an implementing step of heating the FPC, melting the solder, and implementing the circuit component on the component mounting portion.

* * * * *